United States Patent
Poechmueller (10) Patent No.: US 7,372,749 B2
(45) Date of Patent: May 13, 2008

(54) METHODS FOR REPAIRING AND FOR OPERATING A MEMORY COMPONENT

(75) Inventor: Peter Poechmueller, Dresden (DE)

(73) Assignee: Infineon Technologies AG, Munich (DE)

( * ) Notice: Subject to any disclaimer, the term of this patent is extended or adjusted under 35 U.S.C. 154(b) by 351 days.

(21) Appl. No.: 11/274,059

(22) Filed: Nov. 14, 2005

(65) Prior Publication Data

US 2006/0126407 A1   Jun. 15, 2006

(30) Foreign Application Priority Data

Nov. 13, 2004   (DE) ............ 10 2004 054 968

(51) Int. Cl.
*G11C 7/00* (2006.01)
(52) U.S. Cl. ............ 365/200; 365/189.07; 365/230.03; 365/189.04
(58) Field of Classification Search ........ 365/200, 365/189.07, 230.03, 189.04
See application file for complete search history.

(56) References Cited

U.S. PATENT DOCUMENTS

| | | | |
|---|---|---|---|
| 5,619,460 A * | 4/1997 | Kirihata et al. ........... 365/201 |
| 5,909,404 A * | 6/1999 | Schwarz ................... 365/201 |
| 6,272,054 B1 | 8/2001 | Barth, Jr. et al. |
| 6,417,476 B1 | 7/2002 | Offer et al. |
| 6,584,022 B2 * | 6/2003 | Tsuji ....................... 365/200 |
| 6,707,730 B2 * | 3/2004 | Mori et al. ............... 365/200 |
| 6,714,476 B2 | 3/2004 | Hsu et al. |

FOREIGN PATENT DOCUMENTS

EP   0335149   10/1989

* cited by examiner

*Primary Examiner*—Tuan T. Nguyen
(74) *Attorney, Agent, or Firm*—Patterson & Sheridan, L.L.P.

(57) ABSTRACT

In a method for repairing a memory component, data retention times of regular memory cells are determined. Weak regular memory cells having a data retention time that is shorter than a predetermined limit value are determined. A device is programmed in such a manner that a write or read access to the weak regular memory cell is simultaneously also effected for a redundant memory cell in order to jointly read from, or write to, the weak regular memory cell and the redundant memory cell.

20 Claims, 4 Drawing Sheets

METHODS FOR REPAIRING AND FOR OPERATING A MEMORY COMPONENT

CROSS-REFERENCE TO RELATED APPLICATIONS

This application claims foreign priority benefits under 35 U.S.C. §119 to co-pending German patent application number DE 10 2004 054 968.0, filed Nov. 13 2004. This related patent application is herein incorporated by reference in its entirety.

BACKGROUND OF THE INVENTION

1. Field of the Invention

The present invention relates to methods for repairing and operating a memory component and to a memory component, which methods and memory component make it possible to extend refresh times.

2. Description of the Related Art

The reduction of the linear dimensions of memory components, in particular DRAM elements (DRAM=Dynamic Random Access Memory), is reaching physical and economic limits. The ever more extensive reduction of the dimensions of the memory cells and their features requires a very high technical outlay that is continuing to rise. One example is the introduction of dielectrics having a very high dielectric constant as the dielectric of the storage capacitor.

The extreme technological outlay is already offsetting a considerable portion of the cost advantage that results from reducing the linear dimensions (shrink). It is customary for the introduction of a DRAM shrink to be associated with an increase of 10% to 15% in the technology costs, while the cost advantage associated with the shrink is typically in the region of 20% to 30%.

Up until now, the capacitance of the capacitor in a DRAM cell has essentially been kept constant from one generation to the next, no more than approximately 50 to 100 individual memory cells on a single DRAM element having to be repaired. This repair operation is effected by replacing the defective regular memory cells with redundant memory cells. However, it is becoming increasingly more difficult to develop cost-effective DRAM technologies which require only 50 to 100 randomly distributed memory cells to be repaired per chip.

In this case, it is primarily defective memory cells which are replaced. Memory cells which have a short circuit or whose data retention time falls below a first predetermined limit value and is thus unacceptably short are defective.

Memory cells which are not defective but whose data retention time is below a second predetermined limit value are referred to below as weak cells. In this case, the number of weak cells is just as dependent on the requirements imposed on the memory cells and the predetermined limit value as it is on the technology. As described above, each shrink increases the number of weak cells.

The higher the proportion of weak cells in the total number of memory cells of a DRAM element or else of an individual memory block on a DRAM element, the more complicated the repair operation becomes. In particular, the number of weak cells on redundant word lines also increases. The risk or likelihood, when repairing or replacing a defective or weak memory cell on a regular word line, of good memory cells on the regular word line that is to be replaced simultaneously being replaced with weak memory cells on the redundant word line consequently increases. The result is that the number of redundant word lines required and thus the chip area required and the production costs increase more than proportionally.

U.S. Pat. No. 6,272,054 B1 describes a memory architecture having an array of twin memory cells, two memory cells respectively being simultaneously connected to a sense amplifier via a respective bit line.

U.S. Pat. No. 6,714,476 B2 describes a DRAM array that can be operated, in an individual-cell operating mode, as an array of individual cells and, in a twin-cell operating mode, as an array of twin cells. Although there is a high storage capacity in the individual-cell operating mode, it has the disadvantages described above. Although these disadvantages are diminished in the twin-cell operating mode, it is necessary to double the chip area in order to achieve the same storage capacity.

SUMMARY OF THE INVENTION

The object of the present invention is to provide methods for repairing and for operating a memory component and also to provide a memory component, which methods and memory component enable a long refresh time in conjunction with a low chip area requirement.

The present invention is based on the idea of operating a memory component in the individual-cell operating mode as far as possible and of operating it in a twin-cell operating mode only to an extent necessary for weak memory cells whose data retention time is shorter than a predetermined limit value to be read from and written to together with a further memory cell. To this end, in accordance with the present invention, a memory component is repaired by the data retention time of each memory cell first of all being determined. In the simplest case, it is only determined, in this case, whether the data retention time reaches or exceeds a predetermined limit value. A device is then programmed in such a manner that a write or read access to a memory cell that has been identified as being weak is simultaneously also effected for a further memory cell in order to jointly read from, or write to, the weak memory cell and the further memory cell. The device is preferably programmed by storing information about the identity of the weak memory cells, in particular the addresses of the weak memory cells, in a memory or an address memory. The further memory cell is preferably a redundant memory cell.

The present invention can be combined readily and advantageously with a repair operation, in which defective memory cells are replaced with redundant memory cells by diverting write and read accesses to defective memory cells to redundant memory cells in order to read from, and write to, the redundant memory cell instead of the defective memory cell.

Two different groups of redundant memory cells or else a single group of redundant memory cells may be provided for the purpose of repairing defective memory cells by replacing them and repairing (according to the invention) weak memory cells by simultaneously accessing a further memory cell. The second case enables particular flexibility since it is possible to optimize the selection of those memory cells which are provided for the conventional repair operation by replacement and those memory cells which are provided for the repair operation according to the invention by simultaneous access to a further memory cell. In this case, the programmable device preferably comprises a memory or an address memory, which stores, for each memory cell, the other memory cell to which it is assigned and whether it is to replace said other memory cell in accordance with the conventional repair operation or is to be read from at the same time as the other memory cell in accordance with the present invention. Alternatively, the identities or addresses of the memory cells which are intended to be replaced are stored in one part of the memory and the identities or addresses of those memory cells which are intended to be jointly read from are stored in another part of the memory.

In accordance with the present invention, when operating a memory component, it is first of all determined, in the case of a write or read access to a memory cell, whether the latter is a weak memory cell, and, if appropriate, said memory cell is then read from or written to together with an assigned memory cell. The determination of whether a memory cell is a weak memory cell is preferably carried out by reading a memory or an address memory, which was written to in the above-described repair method or a variant thereof.

A chip area, for example for fuses, is required in order to store the identities or addresses of the weak memory cells. More weak memory cells are preferably repaired in the repair operation according to the invention than are replaced in a conventional repair operation. The conventional memory location in the address decoders of the word lines may therefore be unsuitable for reasons of space. In this case, the addresses of the memory cells to be repaired are preferably stored at another location and the addresses of the redundant memory cells are transmitted, via an additional address bus, to an address decoder that is assigned to only the redundant memory cells. Since the number of redundant memory cells is preferably considerably smaller than the number of regular memory cells, use may be made of a shorter address for addressing the redundant memory cells, of a narrower address bus for transmitting the address and of a small decoder for decoding the address, it readily being possible to arrange said decoder directly in the redundant memory cells.

The memory component preferably has a plurality of word lines and a plurality of bit lines which cross the word lines. Each memory cell is arranged at a crossover between a word line and a bit line and may be read from or written to by activating the word line via the bit line. A writing and reading device or a sense amplifier is respectively arranged at the end of a bit line or a pair of bit lines. A simultaneous write or read access to two memory cells is preferably effected, in this case, by activating two word lines, the two memory cells being connected to the same bit line or to bit lines which are connected to the same writing and reading device.

In the architecture described, a plurality of memory cells are connected, via a respective bit line, to a respective writing and reading device by activating a word line. In this case, the address of a memory cell is the address of the assigned word line, and a memory cell is then read from or written to together with a further (redundant) memory cell if at least one weak memory cell is assigned to the word line. A regular memory cell is only then connected to the assigned writing and reading device on its own and is read from or written to on its own if a weak memory cell is not assigned to its address.

One advantage of the present invention resides in the fact that it enables any desired compromise (which can be freely adapted to the respective application and its requirements) to be made between maximizing the refresh time of the memory component and the chip area required. The more redundant memory cells are provided, the better a repair operation is possible and the more weak memory cells can be strengthened by forming twins and the higher the predetermined limit value (beneath which a memory cell is deemed to be weak) of the data retention time can be set.

One particular advantage of the present invention resides in the fact that each operation of repairing a word line effectively makes it possible to only extend the data retention times of all of the memory cells which are assigned to the address of this word line. During conventional repair by replacement, simultaneously replacing all of the memory cells on a word line results in a good memory cell being replaced with a weak memory cell. The higher the number of weak memory cells or the higher said predetermined limit value is set, the more difficult it becomes to avoid this occurrence.

In the worst-case scenario, in accordance with the present invention, a good memory cell is selected and written to or read from together with a weak memory cell. Although this does not extend the effective data retention time, it does not shorten it either.

In this case, it is also no longer possible to distinguish between defective memory cells which, as a result of a short circuit, for example, have the data retention time 0 and weak memory cells which have a finite but excessively short data retention time. Defective memory cells are then no longer replaced in the conventional manner but rather all of the memory cells which are defective or weak are strengthened by forming twins.

In any event, the assignment of redundant and regular word lines is preferably optimized in order to achieve a maximum minimum data retention time within the memory component, which data retention time then represents the refresh time of the latter.

The present invention can be implemented most easily in connection with the conventional distinction between regular memory cells and word lines and redundant memory cells and word lines. However, it is also possible, at the cost of higher complexity of the operation of driving the word lines, to freely form pairs within an array, in which, as a result of the architecture, no distinction is made between a regular area and a redundant area.

A block size of 512 regular word lines, 8 to 10 redundant word lines for a conventional repair operation and 40 to 50 word lines for a repair operation in accordance with the present invention shall be mentioned here as a numerical example. It is clear that, in the case of a repair operation, forming approximately 50 to 60 pairs of any desired word lines makes it possible for the minimum data retention time to be optimized in a far better manner than if one partner of each possible word line pair has respectively already been fixed.

The present invention can be applied not only to DRAM elements but also to any desired memory elements. The data retention time and the refresh period can be optimized, in particular, in volatile memory components.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
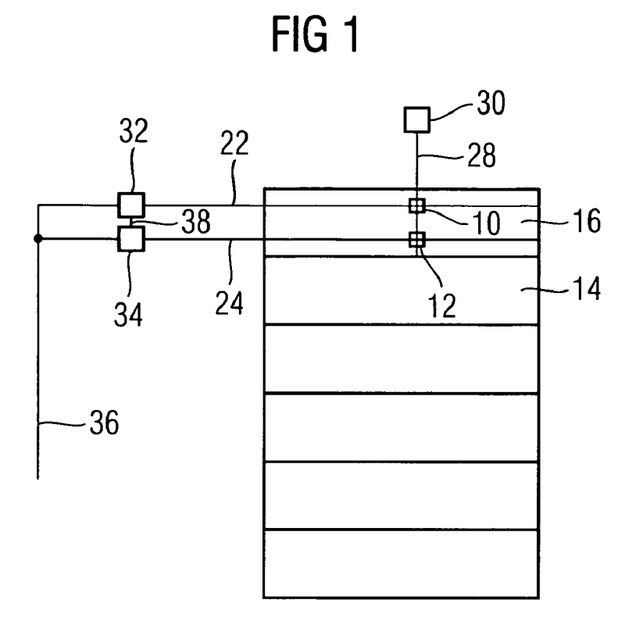
FIG. 1 shows a diagrammatic illustration of a memory component in accordance with a first exemplary embodiment of the present invention.

FIG. 1 is a diagrammatic illustration of a memory component in accordance with the present invention. The memory component has a plurality of memory cells 10, 12 which are arranged in an array 14. To make the illustration clear, only two memory cells 10, 12 are illustrated although the array 14 may comprise overall a virtually arbitrary number of memory cells. The array 14 is subdivided into a plurality of blocks 16. Each block 16 comprises a plurality of word lines 22, 24 which are preferably essentially arranged parallel to one another or with few crossovers between one another. For clarity, only 2 of a total of, for example, a few 100 word lines are in turn illustrated in the first block 16.

A plurality of bit lines 28 intersect the word lines 22, 24, only one bit line 28 being illustrated in turn. Each memory cell 10, 12 is arranged at the crossover between a word line 22, 24 and a bit line 28. Activating a word line 22, 24 or applying an appropriate potential to the latter connects each memory cell 10, 12 on the word line 22, 24 to the assigned bit line 28 and, via the latter, to a writing and reading device 30. Each writing and reading device 30 is connected to one or more bit lines 28. In this context, it is irrelevant whether the bit line 28 illustrated in FIG. 1 represents a single-core bit line or actually a pair of bit lines, one of which is connected to the first memory cell 10 on the first word line 22 and the other of which is connected to the second memory cell 12 on the second word line 24.

A first word line address decoder 32 and a second word line address decoder 34 are assigned to the block 16. The first word line address decoder 32 is connected to regular word lines 22 and the second word line address decoder 34 is connected to redundant word lines 24. The two word line address decoders 32, 34 receive word line addresses via an address bus 36. A word line address is uniquely assigned to each regular word line 22. The address bus 36 is preferably a parallel address bus, which, in the case of 512 regular word lines 22 in the block 16, for example, comprises nine parallel individual lines. The second word line address decoder 34 can use a deactivation line 38 to deactivate the first word line address decoder.

In order to access information that is stored in memory cells 10, 12 in the block 16 and to read out this information or in order to write information to memory cells 10, 12 in the block 16, an address is applied to the address bus 36, the word line address decoders 32, 34 activating one or more word lines 22, 24 on the basis of said address. As a result, all of the memory cells 10, 12 which are connected to the activated word line(s) 22, 24 are connected to the writing and reading devices 30 via the assigned bit lines 28. Each writing and reading device 30 then receives, via the bit line or bit lines 28 connected to it, the information that is stored in the memory cells 10, 12 which are connected to the bit line or bit lines. The writing and reading device 30 can subsequently or simultaneously write new information to the memory cells 10, 12 which are connected to the bit line(s) 28.

The address provided on the address bus 36 generally identifies that regular word line 22 at which the memory cells 10 which are to be read from or written to are arranged. The first word line address decoder 32 decodes the address received via the address bus 36 and activates the corresponding word line 22. The second word line address decoder 34 likewise receives the address via the address bus 36. The second word line address decoder 34 contains an address memory, in which the addresses of defective regular word lines 22 are stored. A word line 22 is deemed to be defective if one of the memory cells 10 connected to the word line 22 is defective.

If the second word line address decoder 34 receives an address of a defective word line 22 via the address bus 36, it uses the deactivation line 38 to deactivate the first word line address decoder 32 so that the latter, for its part, does not activate the defective regular word line 22. At the same time, the second word line address decoder 34 activates a redundant word line 24 assigned to the address of the defective regular word line 22. As a result, the memory cells 12 on the assigned redundant word line 24 are connected, via the bit lines 28, to the writing and reading device 30 instead of the memory cells on the defective regular word line 22.

In accordance with the present invention, the second word line address decoder 34 also contains information about the regular word line 22 to which weak memory cells 10 are assigned. The information about the addresses of the regular word lines 22 having weak memory cells may be stored in the second word line address decoder 34 in such a manner that the addresses of the regular word lines 22 having weak memory cells are stored in a separate address memory. Alternatively, the addresses of defective regular word lines 22 and of regular word lines 22 having weak memory cells are stored in the same address memory, which of the two categories the address belongs to also being stored for each address.

If the second word line address decoder 34 receives, via the address bus 36, an address of a regular word line 22 to which no defective but one or more weak memory cells are assigned, the second word line address decoder 34 activates a redundant word line 24 assigned to the address. However, in contrast to the procedure described above, in the case of an address of a defective regular word line 22, the second word line address decoder 34 does not deactivate the first word line address decoder 32 in this case. A regular memory cell 10 on the activated regular word line 22 and a redundant memory cell 12 on the activated redundant word line 24 are thus simultaneously connected to each writing and reading device 30 via a bit line 28 or a bit line pair 28. Each writing and reading device 30 therefore simultaneously writes to two memory cells 10, 12, with the result that both contain the same information, or simultaneously reads from the two memory cells 10, 12.

If the memory cells 10, 12 are connected to the writing and reading device 30 via one and the same single-core bit line 28, the charges contained in the memory cells 10, 12 are equalized at the moment of reading. If, for example, the weak memory cell 10 contains (almost) no more charge at the time of reading, while the redundant memory cell 12 still essentially contains its full original charge, this charge is distributed between the two memory cells 10, 12 and the bit line 28. Since the capacitance of the bit line 28 is considerably higher than the capacitance of the memory cells, the writing and reading device 30 then receives, via the bit line 28, a signal that approximately corresponds to a fully charged memory cell. In comparison with the signal that would be produced when reading from the weak regular memory cell 10 alone, the signal produced when jointly reading from the weak regular memory cell 10 and the redundant memory cell 12 is considerably larger and, in particular, can be easily detected.

If the regular memory cell 10 and the redundant memory cell 12 are connected to the same writing and reading device 30 via two separate bit lines 28, they are written to in a complementary manner when storing information and, during reading, the writing and reading device forms the differences between the signals produced by the regular memory cell 10 and the redundant memory cell 12. In this case too, the signal produced by the two memory cells 10, 12 or the difference signal of the individual signals in any event has a greater magnitude than the signal produced by the weak regular memory cell 10 alone.

In accordance with another variant, the memory component is designed in such a manner that two redundant word lines can be activated simultaneously instead of one regular word line. This can be readily realized by means of an appropriate design of the second word line address decoder 34. It is possible to achieve maximum flexibility as regards the combination of various word lines and thus an optimum as regards the minimum data retention times which can be achieved if the distinction between regular and redundant word lines is abandoned and any desired pairs of word lines can be activated simultaneously.

Figure 2:
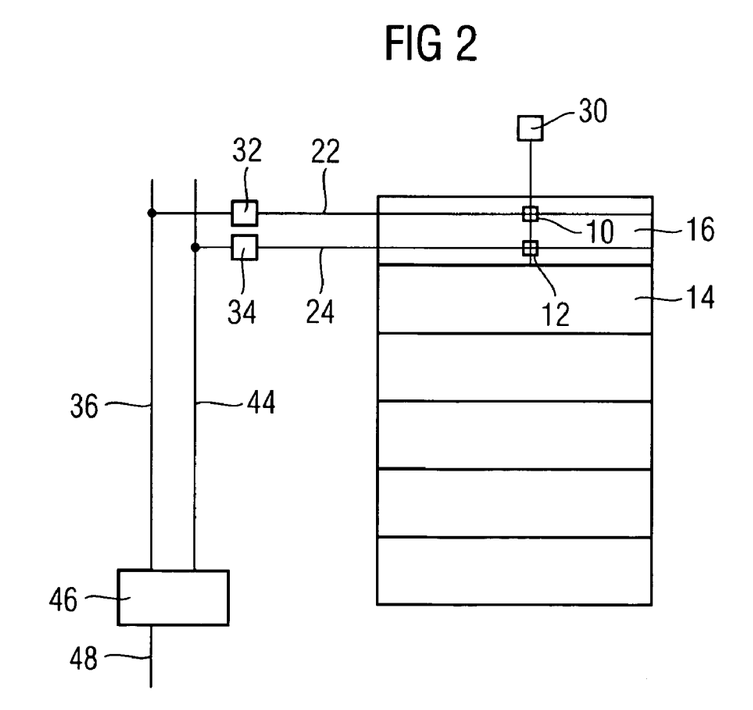
FIG. 2 shows a diagrammatic illustration of a memory component in accordance with a second exemplary embodiment of the present invention.

FIG. 2 is a diagrammatic illustration of a memory component in accordance with a second exemplary embodiment of the present invention. This exemplary embodiment differs from the exemplary embodiment described above with reference to FIG. 1 by virtue of the fact that only the first word line address decoder 32 is connected to the first address bus 36, via which it receives addresses of regular word lines 22. The second word line address decoder 34 is connected to a second address bus 44. A control device 46 is connected to the first address bus 36, to the second address bus 44 and to a third address bus.

In this second exemplary embodiment, the second word line address decoder 34, like the first word line address decoder 32 and like the first word line address decoder 32 from the first exemplary embodiment illustrated in FIG. 1, is a simple decoder, largely without control functions. While the first word line address decoder 32 receives addresses of regular word lines 22 and activates the respective corresponding regular word line 22, the second word line address decoder 34 receives addresses of redundant word lines 24 via the second address bus 44 and respectively activates the corresponding redundant word line 24 in a manner dependent on the address received via the second address bus 44.

The control device 46 contains an address memory, in which the addresses of all of the regular word lines 22 which are assigned defective and/or weak memory cells 10 are stored. Like the second word line address decoder 34 in the first exemplary embodiment described above with reference to FIG. 1, the control device 46 may also contain information in order to distinguish regular word lines 22 which are assigned only weak but not defective memory cells 10 from those which are assigned defective memory cells 10. As in the first exemplary embodiment, this information is coded, for example, at the memory location of the address (one of two address submemories) or is stored at the respective address in an additional register.

If the control device 46 receives, via the third address bus 48, an address of a regular word line 22 that is not assigned any defective or weak memory cells 10, it forwards this address, via the first address bus 36, to the first word line address decoder 32 so that the latter activates the word line 22. In this case, the control device 46 does not output any address to the second word line address decoder 34. Only the regular word line 22 corresponding to the address is thus activated.

If the control device 46 receives, via the third address bus 48, an address of a regular word line 22 that is assigned at least one defective memory cell 10, it passes an address (which has been assigned to this regular word line by the address memory) of a redundant word line 24 to the second word line address decoder 34 via the second address bus 44. In this case, the control device 46 does not output any address via the first address line 36. Only that redundant word line 24 which is assigned to the regular word line having the defective memory cell 10 is thus activated by the second word line address decoder 34.

If the control device 46 receives, via the third address bus 48, the address of a regular word line 22 that is assigned at least one weak but not defective memory cell 10, the control device passes this address to the first word line address decoder 32 via the first address bus 36 and an address (which is assigned to this address) of a redundant word line 24 to the second word line address decoder 34 via the second address bus 44. The regular word line 22 that is assigned a weak memory cell 10 and the redundant word line 24 that is assigned to this regular word line are thus activated simultaneously.

If, as in the above-described variant of the first exemplary embodiment, no distinction is made between defective and weak memory cells, the control device 46 always directly forwards the address received via the third address bus 48 to the first word line address decoder 32 via the first address bus 36. To put it another way, in this case, the third address bus 48 is directly looped through to the first address bus 36. In this case, the address memory in the control device 46 also does not need to contain any information about the distinction between regular word lines 22 which are assigned a defective memory cell 10 and those which are assigned a weak but not defective memory cell 10.

The advantages of the second exemplary embodiment over the first exemplary embodiment can be discerned with reference to a numerical example. If a block 16 comprises 512 regular word lines 22, 8 to 10 redundant word lines 24 are typically provided in the block 16 in order to replace regular word lines 22. To this end, a second word line address decoder 34 has an address memory, which can store a corresponding number (8 to 10) of addresses of regular word lines 22. In accordance with the present invention, 40 to 50 redundant word lines are preferably additionally provided in order to be activated together with regular word lines 22 having weak memory cells 10. The address memory in the second word line address decoder must then have a total capacity of approximately 50 to 60 addresses.

This address memory needs chip area, especially since it is typically constructed from fuses which cannot be miniaturized as desired. This chip area is not available, or is not readily available, at the location of the second word line address decoder 34. In the second exemplary embodiment described above with reference to FIG. 2, the control device 46 having the address memory can be arranged at virtually any desired location on the chip. This considerably simplifies optimization of the layout, in particular as regards the chip area.

Figure 3:
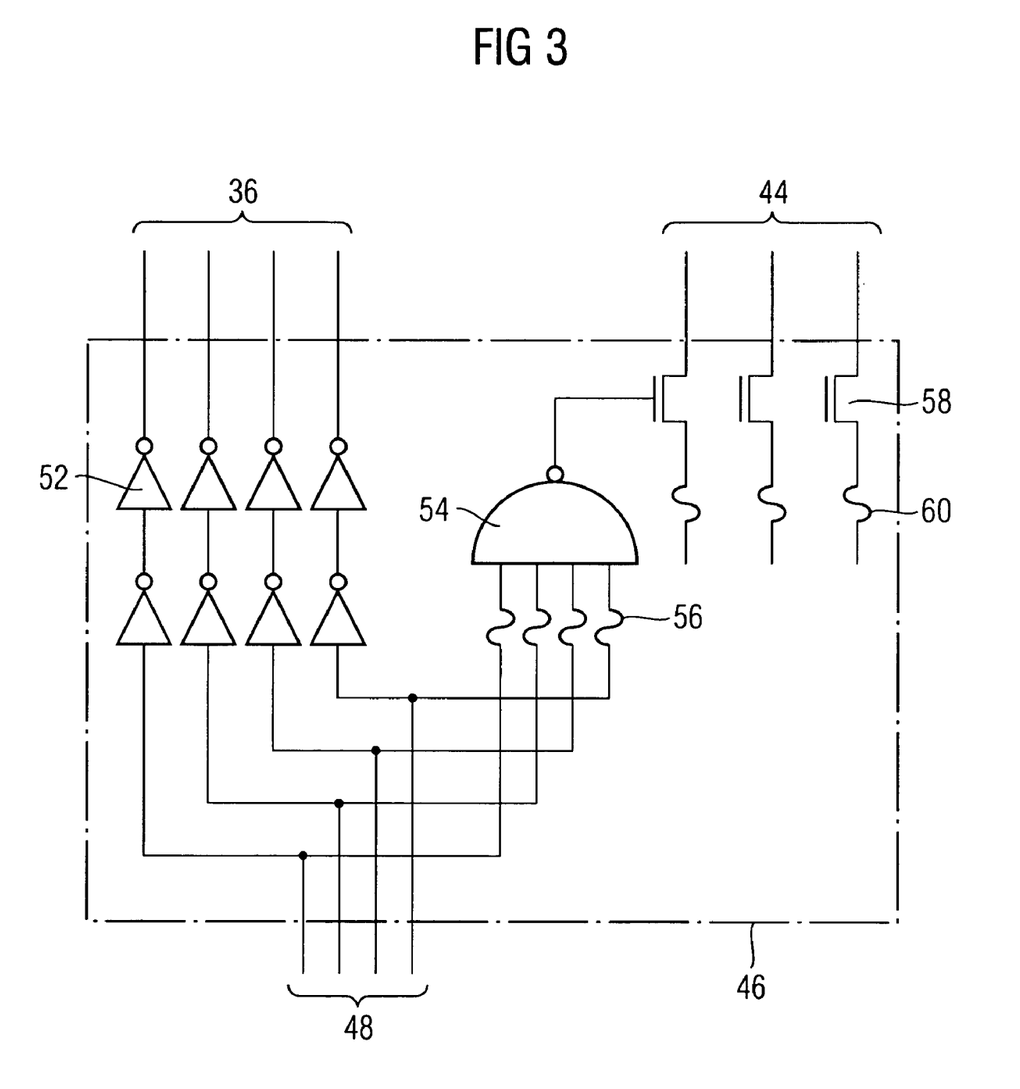
FIG. 3 shows a diagrammatic illustration of an example of a selection device as is used in the second exemplary embodiment.

FIG. 3 is a diagrammatic illustration of an example of the design of the control device 46 of the second exemplary embodiment illustrated in FIG. 2. In contrast to FIG. 2, the address buses 36, 44 and 48 are respectively illustrated here as a plurality of parallel lines. It can be seen that the first and third address buses 36, 48 have the same number of parallel lines and the second address bus 44 has a smaller number of parallel lines. In the numerical example above, the first and third address buses 36, 48 each have a width of 9 bits or lines, while the second address bus 44 has a width of 5 bits ($2^9=512$, $2^5=64$). To make the illustration simple and clear, the address buses in FIG. 3 are each illustrated only with 4 or 3 parallel lines.

The example illustrated in FIG. 3 relates to the above-described variant, in which a word line having a defective memory cell is not replaced in the conventional manner but rather is activated at the same time as a redundant word line. No switches but rather only amplifiers each comprising two cascaded inverters 52 are therefore provided between the third address bus 48 and the first address bus 36. The control device 46 therefore uses the first address bus 36 to output each address received via the third address bus 48.

The control device 46 also contains a plurality of NAND gates 54, only one of which is illustrated. Each individual line of the third address bus 48 is connected to an assigned input of each NAND gate 54 via a fuse 56. The number of NAND gates 54 corresponds to the total number of redundant word lines in the block 16. Any desired addresses of regular word lines may be programmed using the fuses 56. All of the fuses 56 together form the abovementioned address memory.

The output of the NAND gate 54 controls field effect transistors or other switches 58. Addresses (which can be programmed using further fuses 60) of redundant word lines are applied to the second address bus 44 by the switches 58. The illustrated circuit comprising the NAND gate 54, the fuses 56, the switches 58 and the fuses 60 is multiply present in the number of redundant word lines 24. In a departure from FIG. 3, the addresses of the redundant word lines 24 may also be set using a fixed connection instead of using the fuses 60.

Figure 4:
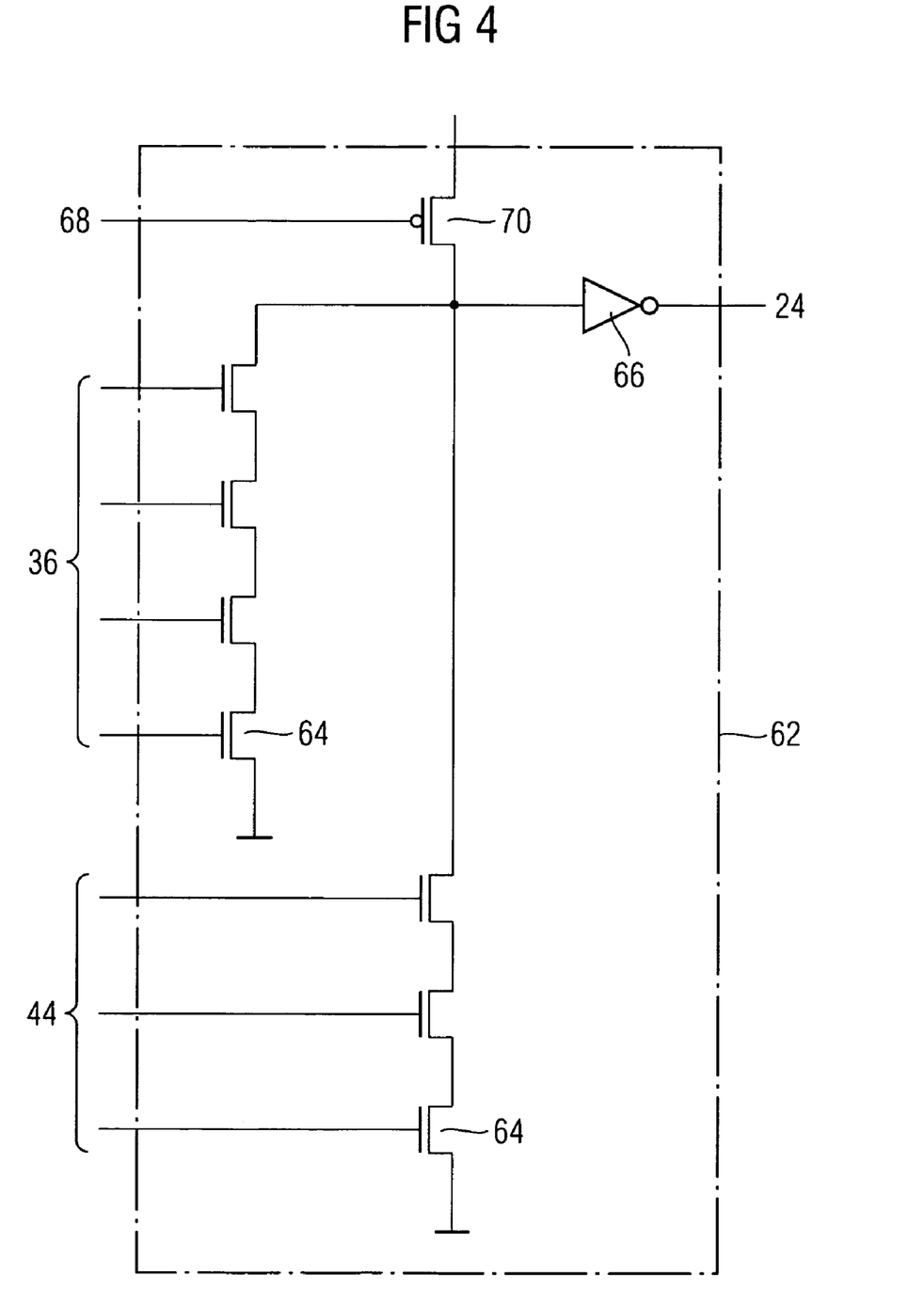
FIG. 4 shows a diagrammatic illustration of an example of word line driving in accordance with a third exemplary embodiment of the present invention.

FIG. 4 is a diagrammatic illustration of that part of the second word line address decoder which is assigned to a single redundant word line 24 in accordance with a variant of the second exemplary embodiment described with reference to FIG. 2. In accordance with this variant, the subcircuit 62 illustrated is connected to both the first address bus 36 and the second address bus 44. The individual lines of the address buses 36, 44 are connected to control inputs of field effect transistors or other switches 64 which are each connected in series between ground and an output amplifier 66 that controls one of the redundant word lines 24. The input of the output amplifier 66 is also connected to a reference-ground potential via a further switch 70 that is controlled by a precharge input 68.

In accordance with this variant, the redundant word line 24 is activated both by means of an address received via the first address bus 36 and by means of an address received via the second address bus 44. Fuses or other types of address memories for programming the addresses which initiate activation are not illustrated here.

FIG. 4 illustrates an example of how redundant word lines 24 can be activated, in a selectively programmable manner, either instead of a regular word line having a defective memory cell or together and at the same time as a regular word line having a weak but not a defective memory cell.

Figure 5:
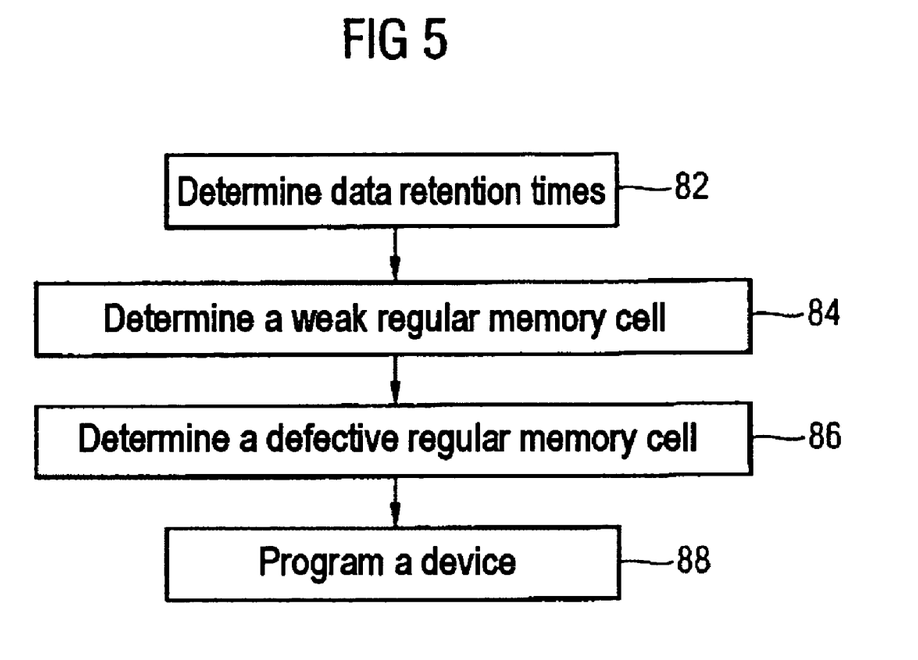
FIG. 5 shows a diagrammatic flowchart of a method in accordance with another exemplary embodiment of the present invention.

FIG. 5 is a diagrammatic flowchart that illustrates a method for repairing a memory component in accordance with the present invention. In a first step 82, the data retention times of all of the regular and preferably also all of the redundant memory cells of the memory component or of a block 16 within the memory component are determined. In a second step 84 and in a third step 86, weak and defective regular memory cells are determined or identified on the basis of the data retention times. In a fourth step 88, a device is then programmed in such a manner that a write or read access to a weak regular memory cell is simultaneously also effected for a redundant memory cell in order to jointly read from, or write to, the weak regular memory cell and the redundant memory cell. The device is also programmed in such a manner that a write or read access to a defective regular memory cell is diverted to a redundant memory cell in order to read from, or write to, the redundant memory cell instead of the defective memory cell.

Figure 6:
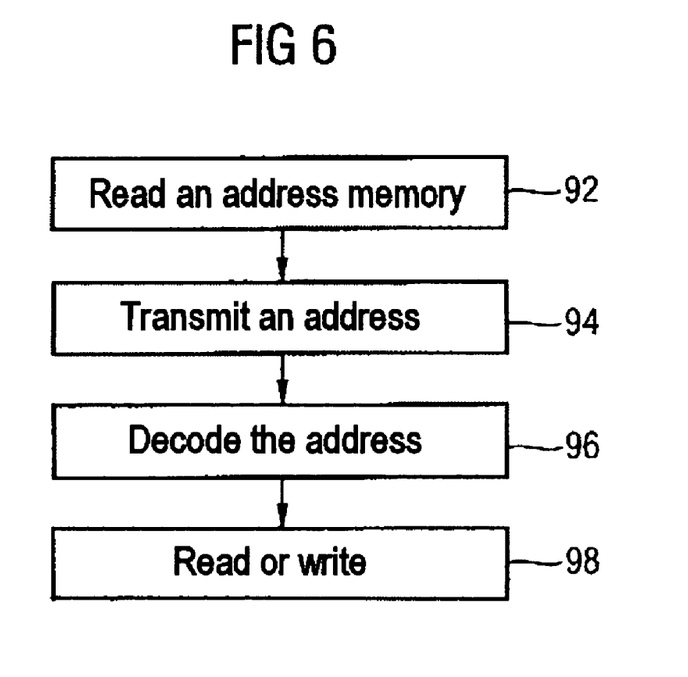
FIG. 6 shows a diagrammatic flowchart of a method in accordance with another exemplary embodiment of the present invention.

FIG. 6 is a diagrammatic flowchart of a method for operating a memory component in accordance with the present invention. In a first step 92, an address memory, in which addresses of weak memory cells and/or addresses of defective memory cells are stored, is read. Weak and/or defective memory cells are thus identified or determined. In a second step 94, an address of a redundant memory cell that is assigned to the weak or defective memory cell is transmitted via an address bus and decoded in a third step 96. In a fourth step 98, depending on whether a defective or a weak memory cell is repaired, the redundant memory cell is read from or written to instead of the latter or at the same time as the latter.

While the foregoing is directed to embodiments of the present invention, other and further embodiments of the invention may be devised without departing from the basic scope thereof, and the scope thereof is determined by the claims that follow.

What is claimed is:

1. A method for repairing a memory device, comprising:
   determining data retention times of memory cells in the memory device;
   determining a weak memory cell having a determined data retention time that is shorter than a predetermined value; and
   programming a device to pair the weak memory cell with a first redundant memory cell so that an access to the weak memory cell effects a simultaneous access to the first redundant memory cell in order to jointly access the weak memory cell and the first redundant memory cell.

2. The method of claim 1, further comprising:
   determining a defective memory cell in the memory device; and
   programming the device of the memory device in such a manner that an access to the defective memory cell is diverted to a second redundant memory cell, whereby the second redundant memory cell is accessed instead of the defective memory cell.

3. The method of claim 1, wherein the access is a write access.

4. The method of claim 1, wherein the access is a read access.

5. A method for operating a memory device, the method comprising:

determining whether a memory cell is a weak memory cell having a data retention time that is shorter than a predetermined value; and if the memory cell is determined to be a weak memory cell, jointly accessing the memory cell and an first assigned redundant memory cell upon receiving an access request directed to the memory cell.

6. The method of claim 5, wherein the determining comprises reading an address memory in which addresses of weak memory cells are stored.

7. The method of claim 5, wherein the accessing the redundant memory cell comprises:

transmitting an address of the first assigned redundant memory cell via an address bus; and decoding the address of the first assigned redundant; the address of the first assigned redundant being shorter than an address of the weak memory cell.

8. The method of claim 5, further comprising:

determining a defective memory cell in the memory device; and accessing a second assigned redundant memory cell in the event of receiving an access directed to the defective memory cell, whereby the second assigned redundant memory cell is accessed instead of the defective memory cell.

9. The method of claim 8, wherein the determining comprises reading an address memory in which addresses of defective memory cells are stored.

10. The method of claim 8, wherein the accessing the redundant memory cell comprises:

transmitting an address of the second assigned redundant memory cell via an address bus; and decoding the address of the second assigned redundant; the address of the second assigned redundant being shorter than an address of the defective memory cell.

11. The method of claim 5, wherein each memory cell is assigned to a word line and to a bit line, the memory cell and the first assigned redundant being assigned to the same bit line; and each memory cell being accessed by activating the assigned word line via the assigned bit line.

12. The method of claim 8, wherein each memory cell is assigned to a word line and to a bit line, the memory cell and the second assigned redundant being assigned to the same bit line; and each memory cell being accessed by activating the assigned word line via the assigned bit line.

13. A memory device, comprising:

a first plurality of memory cells;

a second plurality of memory cells;

an access device for writing and reading data to one or more memory cells for the first and second plurality of memory cells; and a selection device for selecting and connecting the one or more memory cells to the access device; wherein the selection device is configured to:

determine, in the case of a write or read access to a first memory cell of the first plurality of memory cells, whether the first memory cell is a weak memory cell having a data retention time that is shorter than a predetermined time value; and connect the first memory cell and one of the memory cell of the second plurality of memory cells to the access device if the first memory cell is a weak memory cell.

14. The memory device of claim 13, wherein the selection device comprises an address memory, in which addresses of weak memory cells are stored.

15. The memory device of claim 13, wherein the selection device is further configured to:

determine, in the case of an access to the first memory cell, whether the first memory cell is a defective memory cell; and if the first memory cell is determined to be a defective memory cell, connect one of the memory cells of the second plurality of memory cells to the access device instead of the first memory cell.

16. The memory device of claim 15, wherein the selection device comprises an address memory, in which addresses of weak memory cells are stored.

17. The memory device of claim 15, wherein the selection device is configured to connect only the first memory cell to the access device if neither a weak nor a defective memory cell is assigned to an address of the first memory cell.

18. The memory device of claim 13, in which the first plurality of memory cells are regular memory cells and the second plurality of memory cells are redundant memory cells; and in which the first plurality memory cells and the second plurality memory cells are arranged in an array; at least some of the first plurality memory cells respectively being assigned to a regular word line and at least some of the second plurality memory cells respectively being assigned to a redundant word line, and the address of a memory cell in the first and second pluralities of memory cells being the address of the assigned word line, and the access device being a sense amplifier to which a memory cell in the first and second pluralities of memory cells is connected by activating the assigned word line.

19. The memory device of claim 18, further comprising:

an address decoder for decoding addresses of second plurality of memory cells; and an address bus for transmitting addresses of second plurality of memory cells from the selection device to the address decoder; the addresses of the second plurality of memory cells, having been transmitted by the address bus and having been decoded by the address decoder, being shorter than the addresses of the first plurality of memory cells.

20. The memory device of claim 13, further comprising:

an address decoder for decoding addresses of second plurality of memory cells; and an address bus for transmitting addresses of second plurality of memory cells from the selection device to the address decoder; the addresses of the second plurality of memory cells, having been transmitted by the address bus and having been decoded by the address decoder, being shorter than the addresses of the first plurality of memory cells.

* * * * *